United States Patent [19]

Iwase et al.

[11] Patent Number: 5,097,311

[45] Date of Patent: Mar. 17, 1992

[54] SEMICONDUCTOR DEVICE

[75] Inventors: Masao Iwase; Sanae Fukuda, both of Kanagawa; Makoto Yoshimi, Tokyo, all of Japan

[73] Assignee: Kabushiki Kaisha Toshiba, Kanagawa, Japan

[21] Appl. No.: 375,772

[22] Filed: Jul. 5, 1989

[30] Foreign Application Priority Data

Jul. 14, 1988 [JP] Japan .................. 63-173920

[51] Int. Cl.⁵ .................. H01L 27/02; H01L 27/01; H01L 29/78
[52] U.S. Cl. .................. 357/42; 357/40; 357/44; 357/23.7; 357/23.12
[58] Field of Search .............. 357/42, 44, 23.12, 23.7

[56]  References Cited
U.S. PATENT DOCUMENTS

| 3,840,888 | 10/1974 | Gaensslen et al. | 357/23.7 |
| 4,621,276 | 11/1986 | Malhi | 357/42 |
| 4,812,889 | 3/1989 | Kakumu | 357/23.12 |
| 4,885,625 | 12/1989 | Okazawa | 357/42 |
| 4,905,059 | 2/1990 | Shur | 357/16 |
| 4,920,400 | 4/1990 | Barsony | 357/44 |

FOREIGN PATENT DOCUMENTS 62-11788  3/1987  Japan.

OTHER PUBLICATIONS

"Field Effect Transistor Device", Gaensslen et al., IBM Technical Disclosure Bulletin, vol. 13, #11, Apr. 1971, p. 3345.

Primary Examiner—Rolf Hille
Assistant Examiner—Wael Fahmy
Attorney, Agent, or Firm—Finnegan, Henderson, Farabow, Garrett and Dunner

[57]  ABSTRACT

A CMOS inverter circuit incorporating a P channel MOSFET and an N channel MOSFET, both of which can achieve surface conduction, is provided while maintaining the prescribed miniaturization. Thus, the threshold value and conductance of the both MOSFETs are independent of the thickness of the silicon film, and can be easily controlled in the manufacturing processes thereof.

3 Claims, 8 Drawing Sheets

SEMICONDUCTOR DEVICE

BACKGROUND OF THE INVENTION

1. Field of the Invention

This invention relates to a semiconductor device, and more particularly to a CMOS (complementary metal-oxide semiconductor) type semiconductor device that has an improved performance while maintaining its miniaturization.

2. Description of the Prior Art

In general, a CMOS inverter circuit has a configuration as shown in FIG. 6. Specifically, a P channel MOSFET 60 and an N channel MOSFET 61 are connected in series with respect to a power source VDD and ground. Further, these MOSFETs 60 and 61 are connected in parallel with respect to an input terminal IN and an output terminal OUT. The CMOS inverter circuit of FIG. 6 is usually incorporated into a semiconductor integrated circuit (IC), as shown in FIG. 7. In FIG. 7, a P channel MOSFET 60 and an N channel MOSFET 61 are formed on the same semiconductor substrate. Two MOSFETs 60 and 61 are laterally formed adjoining to each other. This configuration interferes with miniaturization to higher densities in the design of CMOS inverter circuits.

To eliminate the above-described disadvantages, a CMOS inverter circuit as shown in FIGS. 8a, 8b and 8c has been disclosed. FIG. 8a is a plan view illustrating a CMOS inverter circuit. In FIG. 8a, an N channel MOSFET 81 and a P channel MOSFET 82 are formed to intersect perpendicularly with each other. A gate portion 80 serves both as a gate of the N channel MOSFET 81 and a gate of the P channel MOSFET 82. FIG. 8b is a cross-sectional view taken along line A—A of FIG. 8a, illustrating the N channel MOSFET 81. FIG. 8c is a cross-sectional view taken along line B—B of FIG. 8a, illustrating the P channel MOSFET 82.

In FIG. 8b, a P type silicon film 88 having a low-impurity concentration is formed on an insulating substrate 87 made of sapphire. A channel, which will be later described, is formed in the silicon film 88. A silicon oxide film 89 is provided surrounding the silicon film 88 so as to achieve isolation between elements. The gate portion 80 comprises a gate electrode 80a and a gate-insulating film 80b.

The N channel MOSFET 81 has an N+ type source region 83 and an N+ type drain region 84. The source and drain regions 83 and 84 are formed on the surface of the silicon film 88 adjoining the gate portion 80. In FIG. 8c, the P channel MOSFET 82 has a P+ type source region 85 and a P+ type drain region 86. The source and drain regions 85 and 86 are formed on the surface of the silicon film 88 adjoining the gate portion 80.

In the above-described CMOS inverter circuit, the channel of the N channel MOSFET 81 is constituted by an inversion layer 91 formed on the surface of the silicon film 88 adjoining the gate-insulating film 80b. Further, the channel is within a depletion layer 90 which spreads in the direction from the gate portion 80 into the silicon film 88. On the other hand, the channel of the P channel MOSFET 82 is within the silicon film 88, and is constituted by a neutral region 92 developed between the depletion layer 90 and the insulating substrate 87. Thus, in the P channel MOSFET 82, positive holes, i.e., carriers move from the source region 85 to the drain region 86 by way of the neutral region 92. Therefore, the conductance and the threshold value of the P channel MOSFET 82 are very dependent on the variations in the thickness of both the silicon film 88 and the depletion layer 90.

FIGS. 9a and 9b schematically illustrate the states of channel formation of the above-described P channel MOSFET 82. FIG. 9a shows the state in the case of a gate voltage Vg<Vthp, and FIG. 9b shows the state in the case of a gate voltage Vg=Vthp (threshold voltage). Specifically, when Vg<Vthp (FIG. 9a), the conductance of the P channel MOSFET 82 is in proportion to the thickness (T-W) of the neutral region 92. This thickness (T-W) is the difference between the thickness T of the silicon film 88 and the thickness W of the depletion layer 90. As the gate voltage Vg is increased, the depletion layer 90 spreads, causing the neutral region 92 to be thinner. Finally, the neutral region 92 disappears, and the thickness W of the depletion layer 90 becomes equal to the thickness T of the silicon film 88. As that point, the gate voltage Vg has reached the threshold voltage Vth. As described above, the threshold voltage Vth is very dependent on the thickness T of the silicon film 88.

Therefore, the spread of the depletion layer and the thickness of the silicon film must be accurately controlled to obtain the prescribed conductance and threshold value of the P channel MOSFET. However, it is difficult to precisely control the thickness of an silicon film. In particular, it is extremely difficult to control the thickness of a silicon film when it is being formed on an insulating substrate made of materials such as sapphire.

SUMMARY OF THE INVENTION

Accordingly, one object of this invention is to provide a semiconductor device incorporating a P channel MOSFET and an N channel MOSFET, which can be miniaturized and in which the conductance and threshold value of the device can be easily controlled.

Briefly, in accordance with one aspect of this invention, there is provided a semiconductor device which comprises a semiconductor substrate, an insulating film on the semiconductor substrate, a first conductive-type region having a low-impurity concentration on the insulating film, a gate-insulating film on the first conductive-type region, a gate electrode on the gate-insulating film, first conductive-type source and drain regions, each having a high-impurity concentration, the first source and drain regions sandwiching the first conductive-type region, second conductive-type source and drain regions, each having a high-impurity concentration, the second source and drain regions sandwiching the first conductive-type region, the second source and drain regions being on a line perpendicular to a line connecting the first source and drain regions, and an electrode on each of the source and drain region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8b is a cross-sectional view taken along line A—A of FIG. 9a;

FIG. 8c is a cross-sectional view taken along line B—B of FIG. 9a; and

DESCRIPTION OF THE PREFERRED EMBODIMENTS

Figure 1:
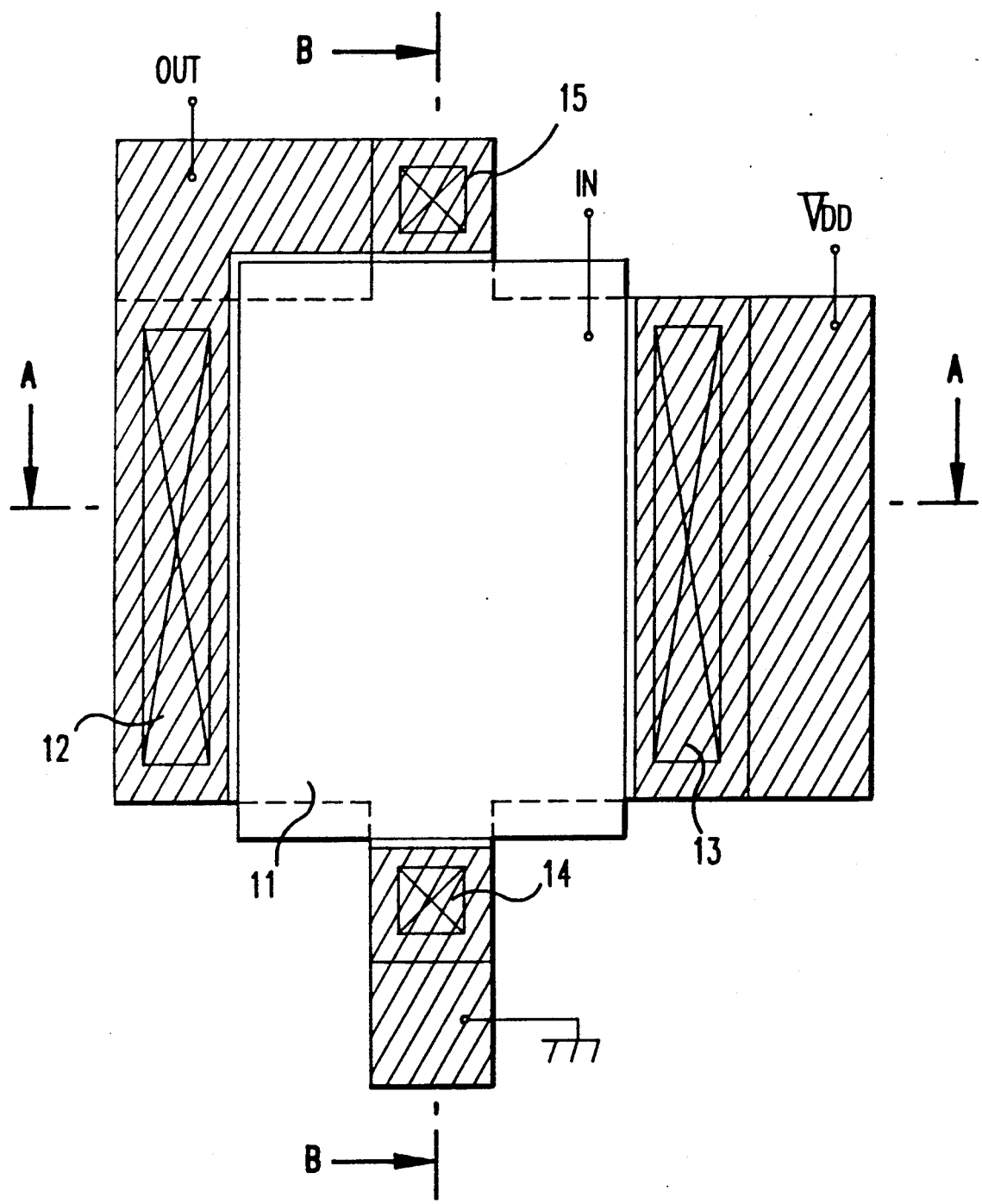
FIG. 1 is a plan view illustrating an essential portion of one embodiment according to the present invention.

Referring now to the drawings, wherein like reference numerals designate identical or corresponding parts throughout the several views, and more particularly to FIG. 1 thereof, one embodiment of this invention will be described.

FIG. 1 is a plan view illustrating one embodiment constituting a CMOS inverter circuit of the present invention. In FIG. 1, a P channel MOSFET is formed in the direction of line A—A, and an N channel MOSFET is formed in the direction of line B—B. A gate electrode 11 is commonly used for the both MOSFETs. A source electrode 13 and a drain electrode 12 of the P channel MOSFET are provided sandwiching the narrower width portion of the gate electrode 11. A source electrode 14 and a drain electrode 15 of the N channel MOSFET are provided sandwiching the broader width portion of the gate electrode 11. Thus, the directions of currents that flow in the respective MOSFETs intersect substantially at right angles. The shaded portions in FIG. 1 represent leads that produce signals to the external circuits.

Figure 2A:
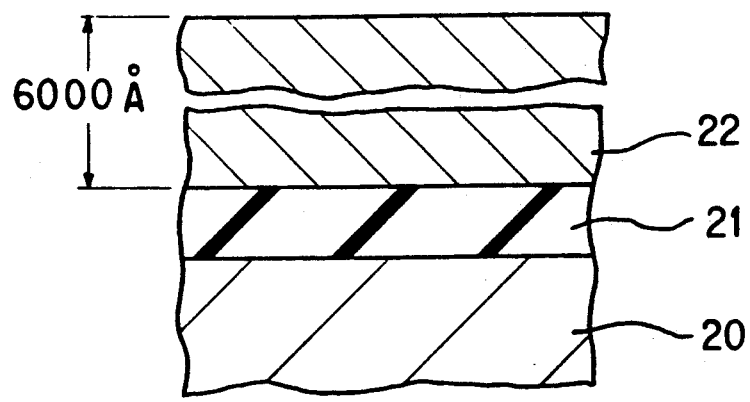
FIGS. 2a through 2f are cross-sectional views taken along line A—A of FIG. 1, illustrating the manufacturing processes of a P channel MOSFET.
Figure 2B:
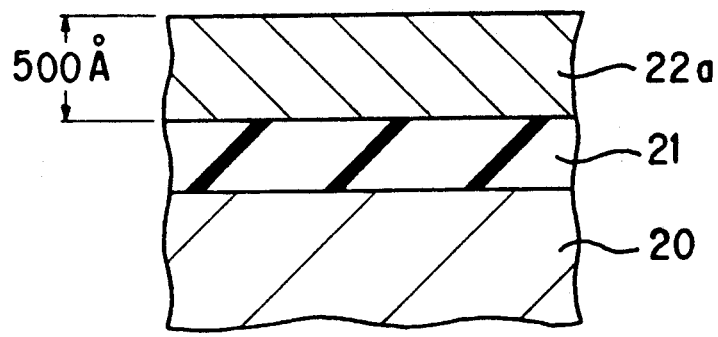
Figure 2C:
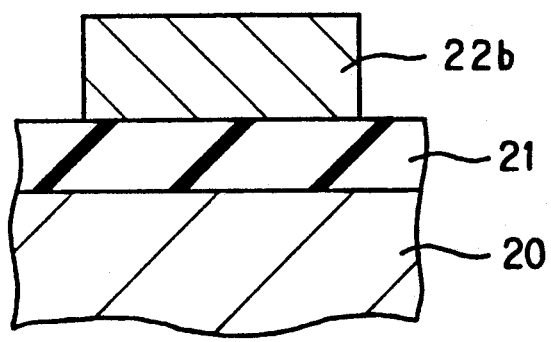

Next, the configurations of the P channel and N channel MOSFETs will be described in detail with reference to FIGS. 2a through 2f and FIG. 3. FIG. 2f is a cross-sectional view taken along line A—A of FIG. 1, illustrating the P channel MOSFET. FIG. 3 is a cross-sectional view taken along line B—B of FIG. 1, illustrating the N channel MOSFET. In FIGS. 2 and 3, only the essential portions are shown, i.e., the portions such as leads of FIG. 1 are omitted. Further, the manufacturing processes of only the P channel MOSFET are shown in FIGS. 2a through 2f. However, the manufacturing processes of the N channel MOSFET are not shown because they are substantially the same as those of the P channel MOSFET. Namely, FIG. 3 shows a finished configuration of the N channel MOSFET.

The manufacturing processes of the P channel MOSFET will be described with reference to FIGS. 2a through 2f. A silicon oxide film 21 (a first insulating film) of about 1 μm thick is formed on the entire surface of a silicon substrate 20, as shown in FIG. 2a. This is performed by the use of a sputtering technique or a CVD (chemical vapor deposition) technique. Next, a polycrystalline silicon film of about 6000 Å thick is formed on the silicon oxide film 21. Thereafter, the thus formed polycrystalline silicon film is changed into a monocrystalline silicon film 22. This is performed by the use of a beam-annealing technique or a heater-annealing technique.

Next, the thickness of the monocrystalline silicon film 22 is reduced from about 6000 Å to 500 Å. The thickness reduction is performed as follows. Specifically, the substrate 20 is exposed to an atmosphere of oxidation so as to oxidize the surface of the film 22. This oxidation causes the film 22 to be thinned, and continues until a prescribed thickness thereof is obtained. Thereafter, this oxide film is eliminated by using a solution of ammonium fluoride. Other film-thickness reduction techniques such as an RIE (reactive ion etching) technique, i.e., a dry etching technique may also be employed. As a result, a monocrystalline silicon film 22a of 500 Å thick is formed on the silicon oxide film 21.

Next, the monocrystalline silicon film 22a is formed into an island-shaped film 22b. Thereafter, a P type impurity such as boron is implanted into the film 22b by the use of ion implantation. Further, the substrate 20 is exposed to an atmosphere of nitrogen, and subjected to a thermal annealing. As a result, a P type silicon film 22b (i.e., an SOI film) having a low impurity concentration is formed. Preferable impurity concentration of the film 22b will be given by $1 \times 10^{15}$ cm$^{-3}$.

Figure 2D:
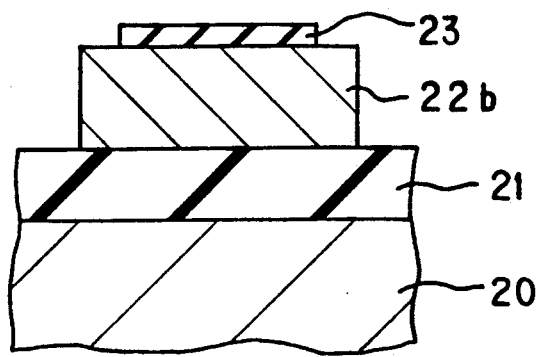
Figure 2E:
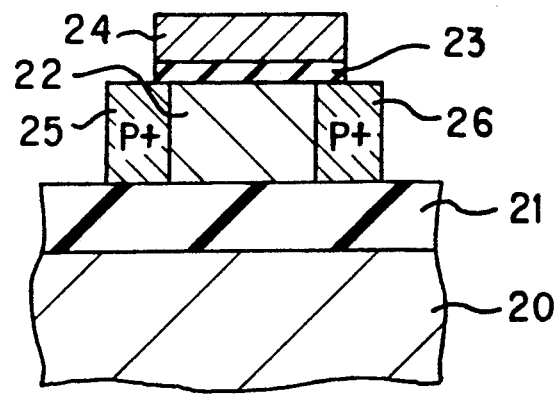
Figure 2F:
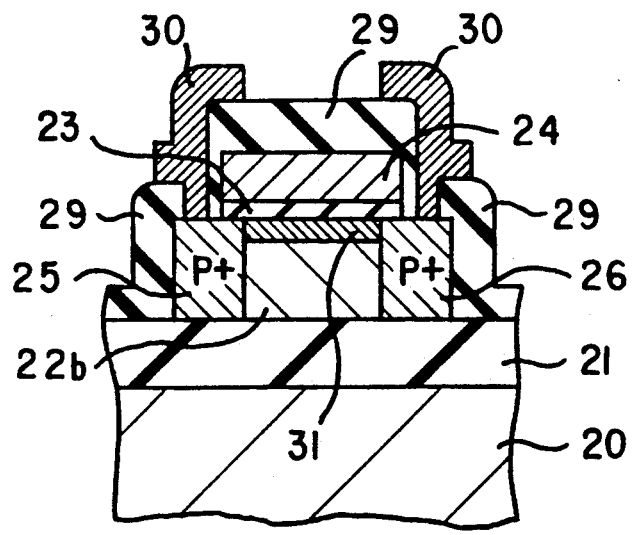
Figure 3:
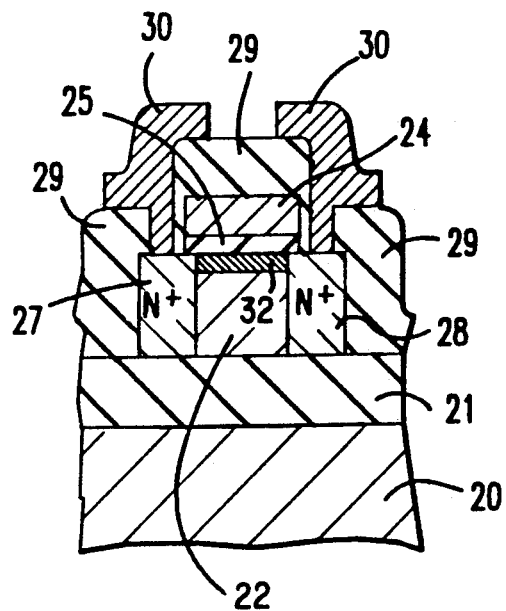
FIG. 3 is a cross-sectional view taken along line B—B of FIG. 1, illustrating an essential portion of the embodiment.

A silicon oxide film of 200 Å thick is formed on the surface of the silicon film 22b by using a thermal oxidationas a gate oxide film 23 as shown in FIG. 2d. Thereafter, a polycrystalline silicon film of 4000 Å thick is formed by the use of an LPCVD (low-pressure chemical vapor deposition) on the gate oxide film 23 and etched by using selective etching technique to form a gate electrode 24 as shown in FIG. 2e. A P$^+$ type source region 25 and a P$^+$ type drain region 26, each having a high-impurity concentration, are formed within the P type silicon film 22b, as shown in FIG. 2e. The source and drain regions 25 and 26 are formed by using the gate electrode 24 as a mask. This is performed by ion implantation in which a P type impurity, such as boron, is implanted in a self-aligned manner. The average impurity concentration of both the source and drain regions 25 and 26 is of the order of $10^{20}$ cm$^{-3}$. Further, the source and drain regions 25 and 26 are formed to reach the interface between the P type silicon film 22b and the silicon oxide film 21. As a result, the reliability in terms of forming electrodes in the source and drain regions 25 and 26 is significantly enhanced.

Next, an insulating film 29 of silicon oxide film is formed covering the entire surface of the device by use of a CVD technique. Thereafter, contact holes are made in the insulating film 29. The contact holes are formed to reach the source and drain regions 25 and 26. Further, metal leads 30 are buried in the contact holes, as shown in FIG. 2f. In this case, any metals that have a satisfactory ohmic contact with respect to the P type semiconductor layer may be used as a material of the metal leads 30. As a result, the P channel MOSFET is formed in the direction of line A—A of FIG. 1.

FIG. 3 is a cross-sectional view illustrating an N channel MOSFET formed in the direction of line B—B of FIG. 1. The N channel MOSFET of FIG. 3 differs from the P channel MOSFET of FIG. 2f in that source and drain regions 27 and 28 are of N-type conductive regions. Further, the width of the P type silicon film 22b (i.e., the SOI film) is greater than that of the P channel MOSFET. The manufacturing processes of the N channel MOSFET are substantially the same as those in the case of the P channel MOSFET. Thus, the detailed descriptions thereof are omitted. However, the source and drain regions 27 and 28 are formed in processes different from those in the case of the P channel MOSFET.

Figure 5:
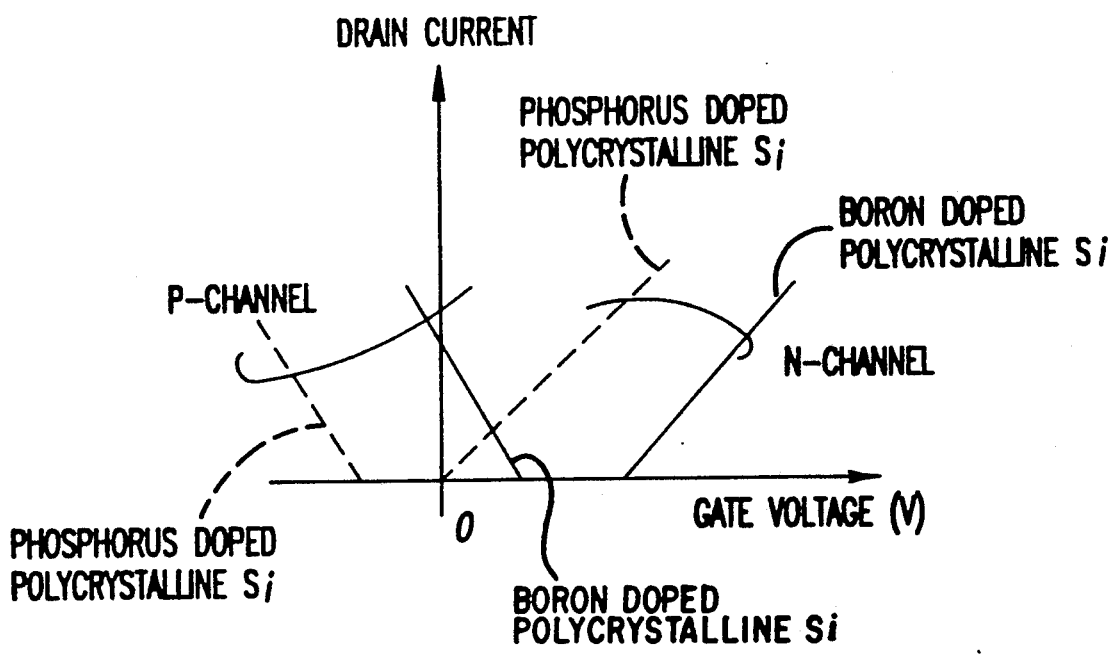
FIG. 5 is a voltage-current characteristic diagram illustrating the operations of one embodiment according to the present invention.
Figure 4A:
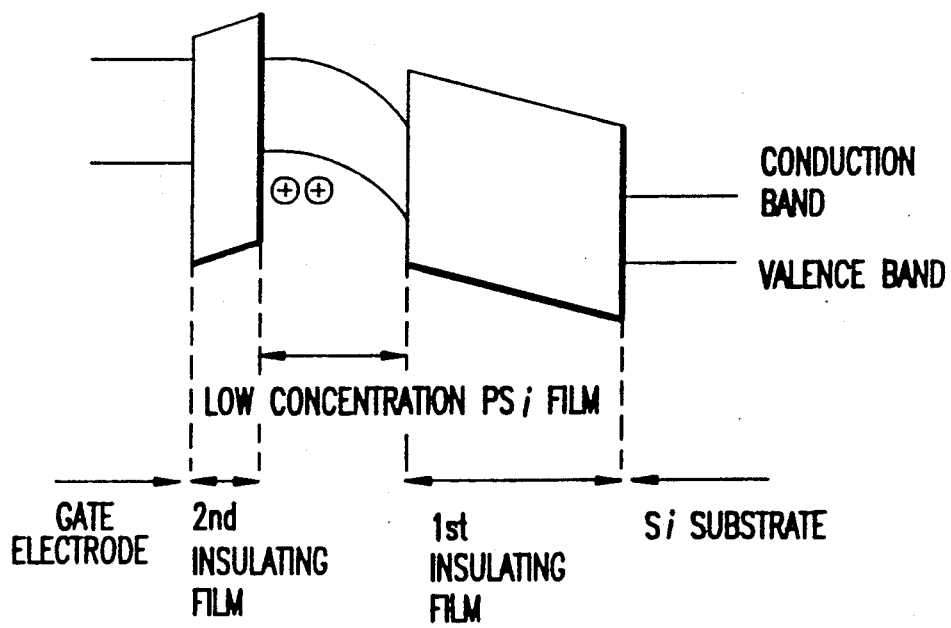
FIGS. 4a and 4b are energy band diagrams of the P channel MOSFET and an N channel MOSFET.
Figure 4B:
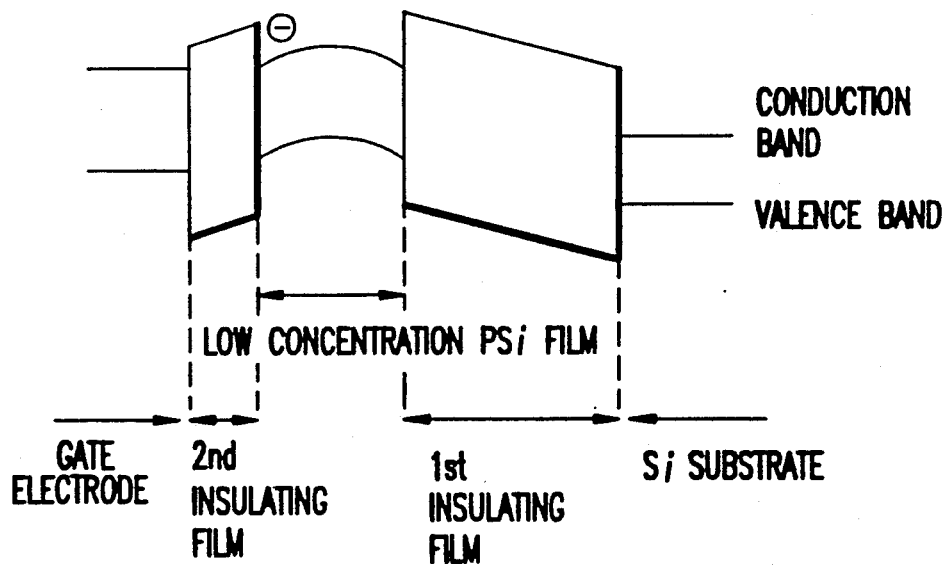
Figure 6:
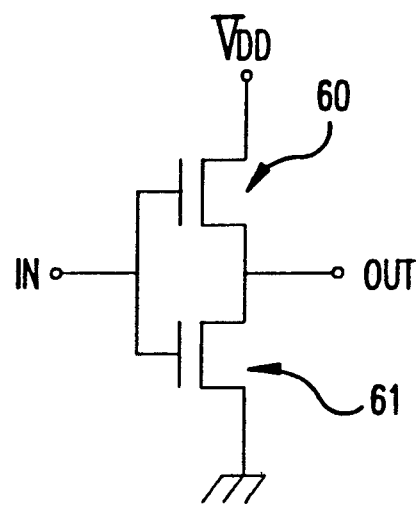
FIG. 6 is an equivalent circuit diagram of a conventional CMOS inverter circuit.
Figure 7:
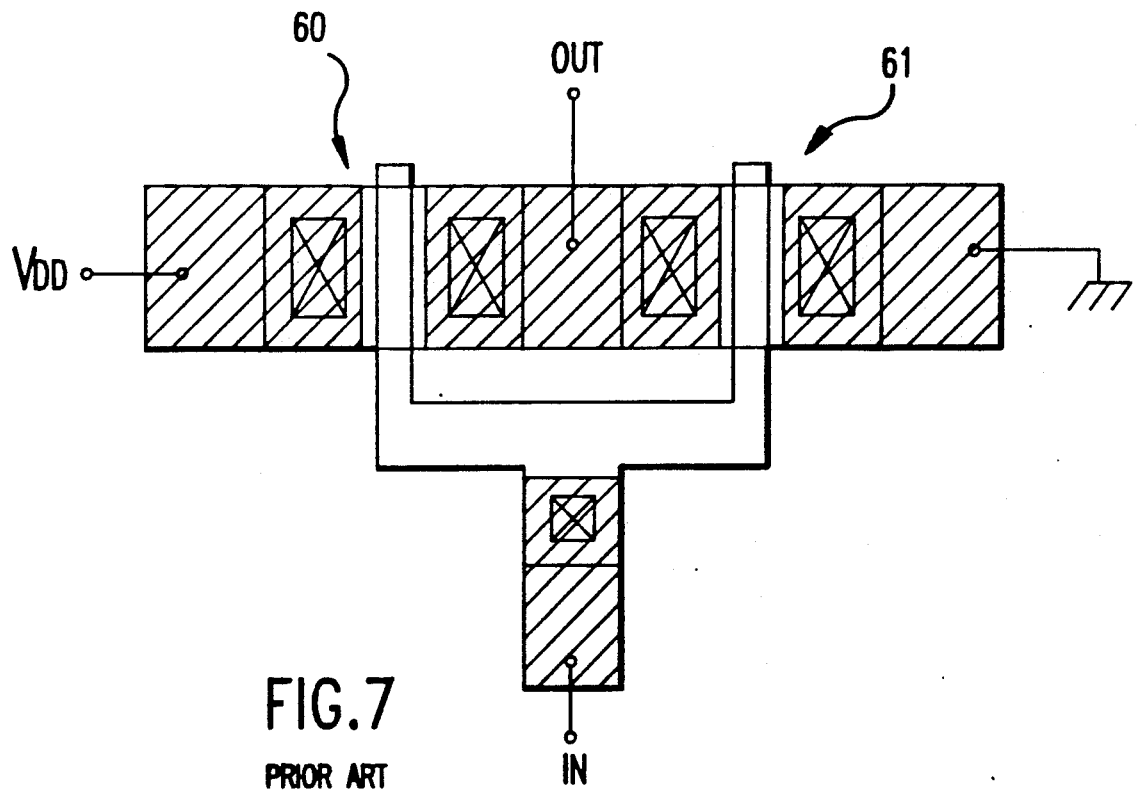
FIG. 7 is a plan view illustrating an essential portion of an integrated circuit incorporating the circuit of FIG. 7.
Figure 8A:
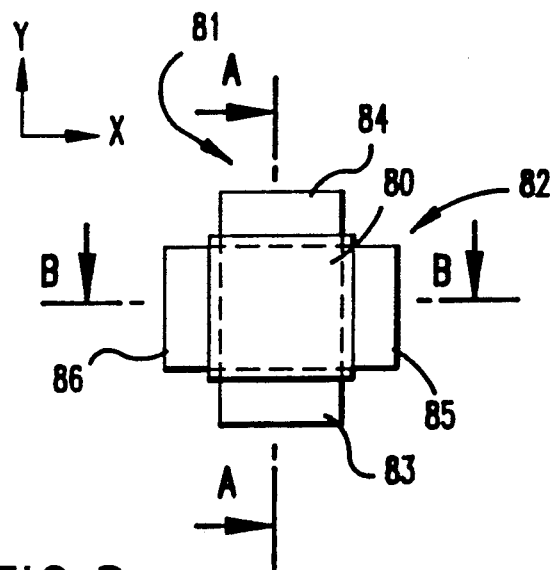
FIG. 8a is a plan view illustrating an essential portion of a conventional semiconductor device.
Figure 8B:
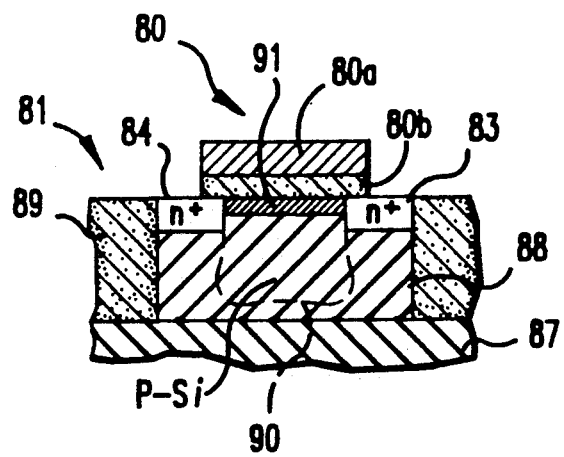
Figure 8C:
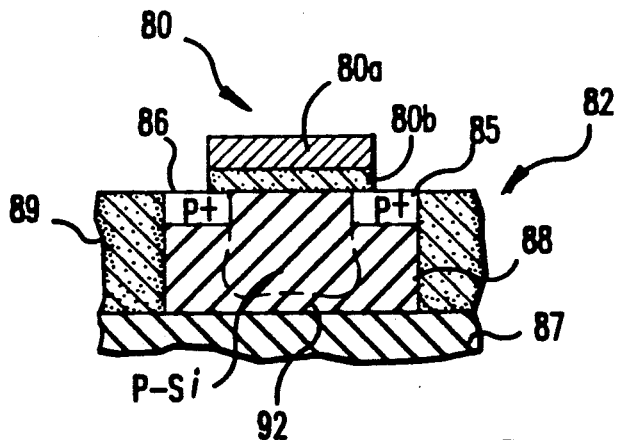
Figure 9A:
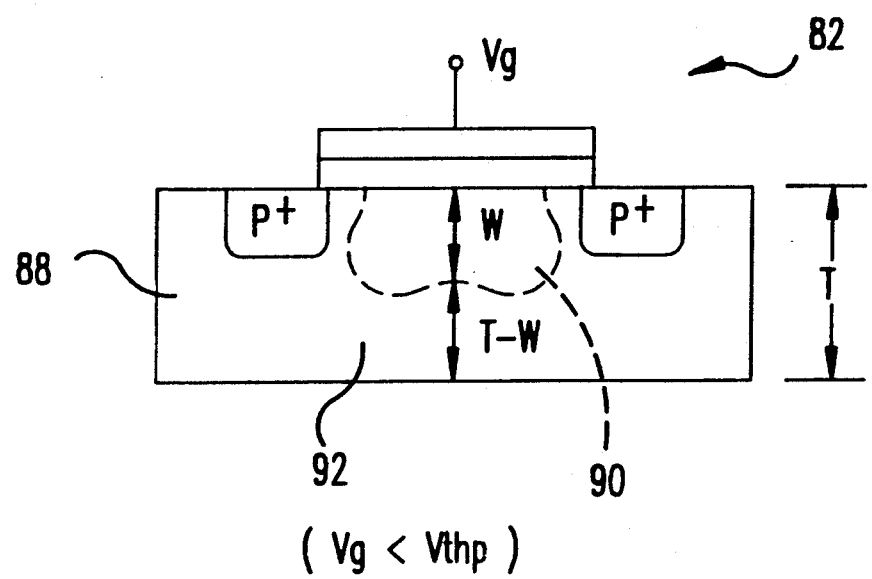
FIGS. 9a and 9b are cross-sectional views illustrating the operations of a conventional P channel MOSFET shown in FIG. 8c.
Figure 9B:
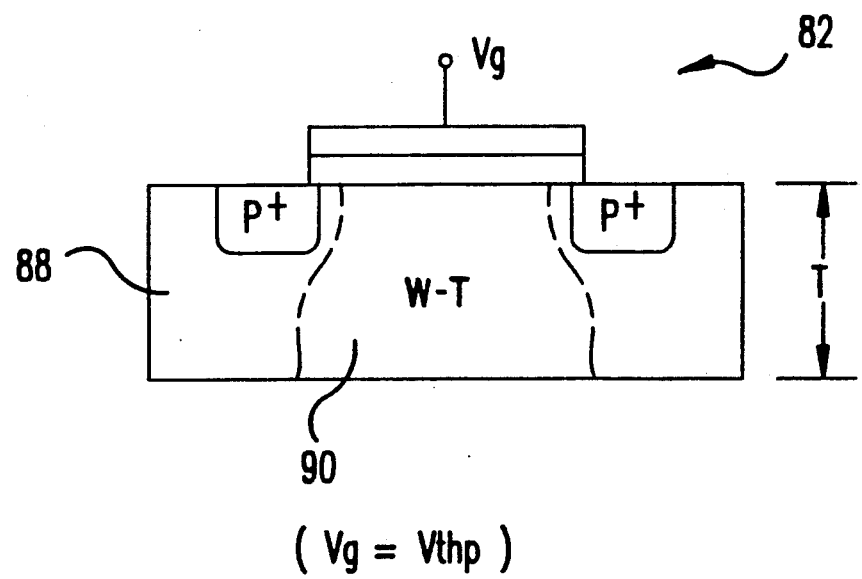

Next, the operations of the above-described P channel and N channel MOSFETs according to the present invention will be described with reference to FIGS. 2f, 4a and 4b. FIG. 4a is an energy band diagram of the P channel MOSFET, and FIG. 4b is an energy band diagram of the N channel MOSFET. First, the operation of the P channel MOSFET will be described. Assume that a bias is applied to the silicon substrate 20 of FIG. 2f. This bias potential is fixed. This applied bias potential changes the entire region of the P type silicon film 22b having a low-impurity concentration into a depletion layer. In this case, the potential distribution of the film 22b is as shown in FIG. 4a. Specifically, as shown in FIG. 5, the potentials within the film 22b become lower towards the gate electrode 24 side, and higher towards the silicon substrate 20 side. Therefore, as the gate voltage is decreased from 2.5 to 0 V, positive holes are increased on the surface of the film 22b, i.e., on the interface between the film 22b and the silicon oxide film 23. As a result, a P type channel region 31 is developed as shown in FIG. 2f. At this instant, the N channel MOSFET maintains a cut-off state. In the previous description, a bias is applied to the silicon substrate 20 to change the entire region of the film 22b into a depletion layer. However, when the impurity concentration of the silicon substrate 20 as well as the impurity concentration of the silicon film 22b or the thickness of the silicon oxide film 21 are properly selected, such a bias potential can be omitted.

As described above, according to the present invention, a P channel MOSFET of a surface conduction type can be obtained. This is in contrast to a conventional P channel MOSFET of a buried channel type.

Further, as the gate voltage is increased from +2.5 V to +3.0 V, the P channel MOSFET becomes cut off. As the gate voltage is further increased from +3.0 V to +5.0 V, an N type inversion layer is induced on the surface of the film 22b, i.e., on the interface between the film 22b and the silicon oxide film 23. As a result, an N channel region 32 is developed, as shown in FIG. 3. At this instant, the energy band diagram of the N channel MOSFET becomes that shown in FIG. 4b. As seen from FIG. 4b, electrons are induced also on the surface of the gate electrode side. Consequently, the N channel MOSFET will have surface conduction characteristics.

To achieve the optimum condition of this invention, the thickness W of the P type silicon film 22b having a low-impurity concentration must be smaller than the value obtained from the following equation A;

$$\frac{\epsilon'}{q \cdot Csub} \left[ \left( \frac{qTbox \cdot Csub}{\epsilon \, ox} \right)^2 - \frac{2q \cdot Csub}{\epsilon'} (Vfb - Vsub) \right]^{\frac{1}{2}} - \frac{Tbox \cdot \epsilon'}{\epsilon \, ox} \quad (A)$$

Where Vfb = the flat-band voltage between the silicon substrate 20 and the P type silicon film having a low-impurity concentration, $\epsilon'$ = a dielectric constant of the P type silicon film having a low-impurity concentration, $\epsilon$ ox = a dielectric constant of the first insulating film, Tbox = the thickness of silicon dioxide, Csub = the impurity concentration in the P type silicon film having a low-impurity concentration, Vsub = a substrate potential which does not invert on the surface of the P type silicon film having a low-impurity concentration, and q = electronic charge ($1.60 \times 10^{-19}$ C.).

Above-mentioned upper limit of the thickness of the P type silicon film 22b having a low-impurity concentration is given as the solution of a quadratic equation for the film thickness W;

$$Vfb + Tbox \frac{qCsub}{\epsilon \, ox} \cdot W + \frac{1}{2} \frac{qCsub}{\epsilon'} W^2 = Vsub$$

Specifically, Vsub = 0v, Vfb = −0.80 V (when the substrate 20 has an impurity concentration of $1 \times 10^{20}$ cm$^{-3}$), $\epsilon$ ox = $3.45 \times 10^{-13}$ F/cm, q = $1.60 \times 10^{-19}$ C., Tbox = 1 μm, and Csub = $1 \times 10^{15}$ cm$^{-3}$. As a result, the upper limit of the thickness of the silicon film 22b is 1700 Å.

To completely cut off the leakage current in the rear silicon surface, it is more preferable in FIG. 4b that the front silicon surface becomes inverted earlier than the rear silicon surface. Let Vtnf, Vtnb be the threshold voltages of the front and the rear silicon surfaces respectively, then the above condition is given by Vtnf ≦ Vtnb. From a simple calculation, Vtnf and Vtnb are given as follows.

$$Vtnf = Vfb - (2\Phi f - \Phi 1) \times \frac{Tox + Tbox + \beta^{-1} \cdot w}{Tbox + \beta^{-1} \cdot w}$$

$$Vtnb = Vfb - (2\Phi f - \Phi 2) \times \frac{Tox + Tbox + \beta^{-1} \cdot w}{Tbox}$$

where Vfb = flat-band voltage between the gate electrode 24 and the P type silicon film 22b, $\Phi f$ = Fermi energy of the P type silicon film 22b, Tox = thickness of the gate oxide 23, $\beta = \epsilon'/\epsilon$ ox.

$\Phi 1$ and $\Phi 2$ are given by the following equations.

$$\Phi 1 = \frac{Tox(Vsub - V1)}{Tox + Tbox + \beta^{-1} \cdot w}$$

$$\Phi 2 = \frac{qCsub \, w^2}{2\epsilon'} + \frac{(Tox + \beta^{-1} \cdot w)(Vsub - V1)}{Tox + Tbox + \beta^{-1} \cdot w}$$

where V1 is given by $$V1 = Vfb + \frac{qCsub \, w^2}{2\epsilon'} + \frac{qCsub \, w \, Tbox}{\epsilon \, ox}.$$

Further, in this embodiment, a thickness W and an impurity concentration Csub may be determined to various appropriate values as long as the condition of the equation above is satisfied. For example, in the case of Vsub = 0v, and Csub = $5 \times 10^{15}$ cm$^{-3}$, W can be 950 Å. Similarly, Tbox may be determined to various values, but a value of the order of 5000 Å through 1 μm is desirable.

Moreover, in this embodiment, a boron-doped polycrystalline silicon film 24 is used as a gate electrode. However, other materials such as a silicide containing Ti, Co, Ni, Mo, Rh, Pd, Ta and W, or one of metals such as Ti, V, Cr, Co, Nb, Mo, Rh, Ta and W may also be used. The appropriate selection from these materials can achieve prescribed operating conditions better than those of a conventional CMOS inverter circuit in which a phosphorus-doped polycrystalline silicon film in used as a gate electrode.

FIG. 5 is a graph illustrating gate voltage versus drain current characteristics of the CMOS inverter circuit according to the present invention. As shown from FIG. 5, when boron-doped polycrystalline silicon is used as a material of the P type silicon film, the threshold value of the CMOS inverter circuit can be moved towards the positive gate voltage region. As a result, both the N channel and P channel MOSFETs can be used in the positive gate voltage region.

Further, as shown in FIG. 1, the channel length between the source and drain electrodes of the P channel MOSFET is smaller than the channel length between the source and drain electrodes of the N channel MOSFET. This configuration allows both MOSFETs to be operated by substantially the same driving power. Specifically, the positive hole mobility in the P channel MOSFET is smaller than (about ½) the electron mobility of the N channel MOSFET. Thus, the configuration of FIG. 1 can compensate for the difference between the mobilities in both MOSFETs.

As described above, in the CMOS inverter circuit according to the present invention, both the P channel and N channel MOSFETs can achieve surface conduction while maintaining their miniaturization. Therefore, the threshold value and conductance of the both MOSFETs are independent of the thickness of the silicon film. Moreover, in a conventional MOSFET, a neutral region exists in the SOI film when a channel region is formed. This inevitably causes a drain current to be leaked. However, in the MOSFET according to the present invention, the entire portion of the silicon film except channel region becomes a depletion layer, i.e., leaving no neutral region. As a result, the occurrence of such a drain current leakage can be prevented.

Obviously, numerous additional modifications and variations of the present invention are possible in light of the above teachings. It is therefore to be understood that within the scope of the appended claims, the invention may be practiced otherwise than as specifically described herein.

What is claimed is:

1. A semiconductor device, comprising:
a semiconductor substrate having a substantially planar surface;
means for applying a bias potential to said semiconductor substrate;
an insulating film on said semiconductor substrate;
a first conductive-type region having a low-impurity concentration on said insulating film;
a gate-insulating film on said first conductive-type region;
a gate electrode on said gate-insulating film;
first conductive-type source and drain regions, each having a high-impurity concentration, said first source and drain regions sandwiching the first conductive-type region;
second conductive-type source and drain regions, each having a high-impurity concentration, said second source and drain regions sandwiching said first conductive-type region, said second source and drain regions being on a line perpendicular to a line connecting said first source and drain regions; and
an electrode on each said source and drain region;
wherein a thickness W of said first conductive-type region in a direction perpendicular to the planar surface of the substrate is smaller than a value obtained from the following equation, $$\frac{\epsilon'}{q \cdot Csub} \left[ \left( \frac{qTbox \cdot Csub}{\epsilon ox} \right)^2 - \frac{2q \cdot Csub}{\epsilon'} (V'fb - Vsub) \right]^{\frac{1}{2}} - \frac{Tbox \cdot \epsilon'}{\epsilon ox}$$

where V'fb=the energy difference in Fermi levels between said first conductive-type region and said semiconductor substrate, $\epsilon'$=the dielectric constant of said first conductive-type region, $\epsilon$ ox=the dielectric constant of said insulating film, Tbox=-the thickness of said insulating film, q=electron charge, Csub=the impurity concentration in said first conductive-type region, and Vsub=the substrate potential at the surface of said first conductive-type region closest to the substrate.

2. A semiconductor device, comprising:
a semiconductor substrate having a substantially planar surface;
means for applying a bias potential to said semiconductor substrate;
an insulating film on said semiconductor substrate;
a first conductive-type region having a low-impurity concentration on said insulating film;
a gate-insulating film on said first conductive-type region;
a gate electrode on said gate-insulating film;
first conductive-type source and drain regions, each having a high-impurity concentration, said first source and drain regions sandwiching the first conductive-type region;
second conductive-type source and drain regions, each having a high-impurity concentration, said second source and drain regions sandwiching said first conductive-type region, said second source and drain regions being on a line perpendicular to a line connecting said first source and drain regions; and
an electrode on each said source and drain region;
wherein a threshold voltage of a front side surface of the first conductive-type region contacting the gate insulating film is smaller than a threshold voltage of a back side surface of the first conductive-type region contacting the insulating film.

3. A semiconductor device, comprising:
a semiconductor substrate having a substantially planar surface;
means for applying a bias potential to said semiconductor substrate;
an insulating film on said semiconductor substrate;
a first conductive-type region having a low-impurity concentration on said insulating film;
a gate-insulating film on said first conductive-type region;
a gate electrode on said gate-insulating film;
first conductive-type source and drain regions, each having a high-impurity concentration, said first source and drain regions sandwiching the first conductive-type region;
second conductive-type source and drain regions, each having a high-impurity concentration, said second source and drain regions sandwiching said first conductive-type region, said second source and drain regions being on a line perpendicular to a line connecting said first source and drain regions; and an electrode on each said source and drain region;

wherein said first conductive-type source and drain regions are P type regions, and said second conductive-type source and drain regions are N-type regions, and wherein a channel length between said P-type source and drain regions is smaller than a channel length between said N-type source and drain regions.

* * * * *